United States Patent [19]
Tribes
[11] 3,772,098
[45] Nov. 13, 1973

[54] METHOD OF MANUFACTURING A FIELD EFFECT TRANSISTOR

[75] Inventor: Rene Tribes, Paris, France
[73] Assignee: CSF-Compagnie Generale de Telegraphie Sans Fil, Paris, France

[22] Filed: Aug. 3, 1971
[21] Appl. No.: 168,776

Related U.S. Application Data

[60] Division of Ser. No. 833,845, May 28, 1969, abandoned, which is a continuation-in-part of Ser. No. 603,046, Dec. 19, 1966, abandoned, which is a continuation-in-part of Ser. No. 318,450, Oct. 24, 1963, abandoned.

[30] Foreign Application Priority Data

Nov. 2, 1962 France ............................ 62914159

[52] U.S. Cl. ................. 148/189, 148/186, 148/187, 317/235 R, 29/571
[51] Int. Cl. ........................... H01l 7/44, H01l 11/00
[58] Field of Search .................... 148/189, 187, 186; 317/235 R; 29/571

[56] References Cited

UNITED STATES PATENTS

| | | | |
|---|---|---|---|
| 3,056,888 | 10/1962 | Atalla | 317/235 B X |
| 3,233,186 | 2/1966 | Theriault | 148/187 UX |
| 3,576,477 | 4/1971 | Kooi | 317/235 B |
| 2,816,847 | 12/1957 | Shockley | 148/187 X |
| 3,378,738 | 4/1968 | McIver | 317/235 B |
| 3,427,212 | 2/1969 | Allison | 148/189 X |

*Primary Examiner*—G. T. Ozaki
*Attorney*—Cushman, Darby & Cushman

[57] ABSTRACT

A method of manufacturing field effect semiconductor devices has been developed which comprises the steps of forming a silica layer on a silicon plate of selected conductivity-type, etching the layer over a predetermined surface portion, thus forming a window of bare silicon and forming another silica layer upon a portion of the window by masking thereby forming first and second regions in the window separated from each other by the other silica layer having a thickness less than the first mentioned silica layer. Further steps include diffusing activator impurities in the substrate in the window of opposite conductivity-type which form within the first and second regions respective source and drain regions. Thereafter the silicon plate is placed in a gas carrying a doping agent which thereby forms a channel under the other silica layer and thereafter metallic contacts are deposited upon the source and drain regions and a metal gate is deposited on the other silica layer.

1 Claim, 3 Drawing Figures

INVENTOR
RENE TRIBES

BY Cushman, Darby & Cushman
ATTORNEYS

METHOD OF MANUFACTURING A FIELD EFFECT TRANSISTOR

This application is a division of Ser. No. 833,845 filed May 28, 1969, now abandoned, which is a continuation of Ser. No. 603,046 filed Dec. 19, 1966 now abandoned, which is a continuation of Ser. No. 318,450 filed Oct. 24, 1963 now abandoned.

The present invention relates to the field effect semiconductor micro-components obtained by diffusion of a suitable impurity on the surface of a silicon plate masked by a layer of silica in which blanks have been arranged by a photo-engraving technique.

For the preparation of these micro-components, various masking and diffusion techniques have been proposed, none of which gives full satisfaction and none of which, in particular, permits the preparation of micro-components fitted with a control grid or gate on both sides.

It is an object of the invention to provide a method giving full satisfaction in the production of such components.

According to the method of the invention a layer of silica is formed on the part of the surface of an *n* or *p* type silicon plate along which there will be formed the channel of the field effect micro-components, and an impurity of suitable sign is diffused through said silica layer and over the whole of the surrounding exposed surface.

An important feature of the micro-component obtained by means of said process consists in that the other side of the plate has not been masked and that a control gate can be formed thereon. Also, the channel obtained in this way may be very short and the access resistances to that channel particularly low.

The invention will be better understood from the following description and the appended drawing, wherein.

Figure 1:
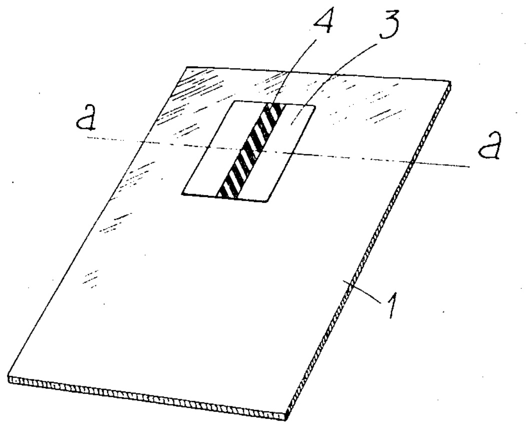
FIG. 1 shows a silicon plate on a part of which a field effect micro-component has been obtained according to the invention.
Figure 2:
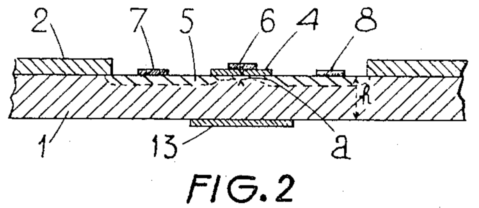
FIG. 2 is a cross-section along the line *a—a* of FIG. 1.

In FIG. 2 the micro-component is on a considerably enlarged scale and its thickness *h* exaggerated for clarity. In actual fact thickness *h* may be of the order of 100 $\mu$, for example.

The micro-component according to the invention is obtained as follows:

On a silicon plate 1 for example of the *p* type, a silica layer 2, with a thickness, for example of 0.4 $\mu$ is formed. This silica layer is obtained, for example, by placing plate 1 for 30 minutes in an oven whose temperature is raised to 1,200° C, in a current of oxygen bubbing through water at a temperature of 80° C.

This silica layer is removed by known photo-engraving techniques in the area of the plate where it is desired to form the micro-component. In the window 3 so prepared, a strip 4 of a silica layer 0.2 $\mu$ in thickness is formed with, for example, a width of 70 $\mu$. This silica layer is obtained as explained above, but with the duration of the treatment reduced to 16 minutes. A suitable mask is used for protecting the other parts of the window from removal while carrying out the photo-engraving techniques.

There is then diffused in window 3 an impurity capable of modifying the type of conductivity of the plate, such as phosphorus, in the present case.

To this end, the plate may be placed in an oven in a $P_2O_5$ atmosphere at a temperature of 1,140° C for a duration appropriate for securing a suitable depth of diffusion, such as 30 minutes in the example described.

This produces a layer 5 with, for example, a thickness not greater than 3 microns. Coextensively with strip 4, the diffusion zone is much shallower, but it nevertheless exists, so that a channel is formed of thickness *a* of the order of one micron, for example.

It is to be noted that the field effect micro-component obtained by this process operates in a conventional manner. All that is needed to this effect is to provide the structure with suitable electrodes; for example ohmic contacts 6, 7, 8 and 13 are produced by evaporation of aluminum or gold in vacuo.

The method of the invention for masking the region of the structure which is to constitute the channel, makes it possible, if desired, forming a very short channel. Because of the shape of the diffusion profile, the width of the channel is less than the width of mask 4. Also there is no risk of causing a spark which might be due to the fact that, when the channel is very short, the electric field present is very intense; for, in this respect; the silica layer 4 acts as a protector layer.

The thickness of this channel can be very small; it depends on diffusion time which is readily controlled.

Due to the method used, impurity concentration in the channel is lower than the neighbouring areas. The effect of this is, for a given concentration under the silica strip 4, a reduction of the access resistances to the channel.

Also, the component described can be controlled from both its sides, i.e., from gates 6 and 13. In the example given, and for the dimensions indicated, the voltage at the knee of its characteristic will be equal to 10V, and maximum current, equal to 2 mA, will be cut off by the application of a voltage of 3 V at gate 13.

Figure 3:
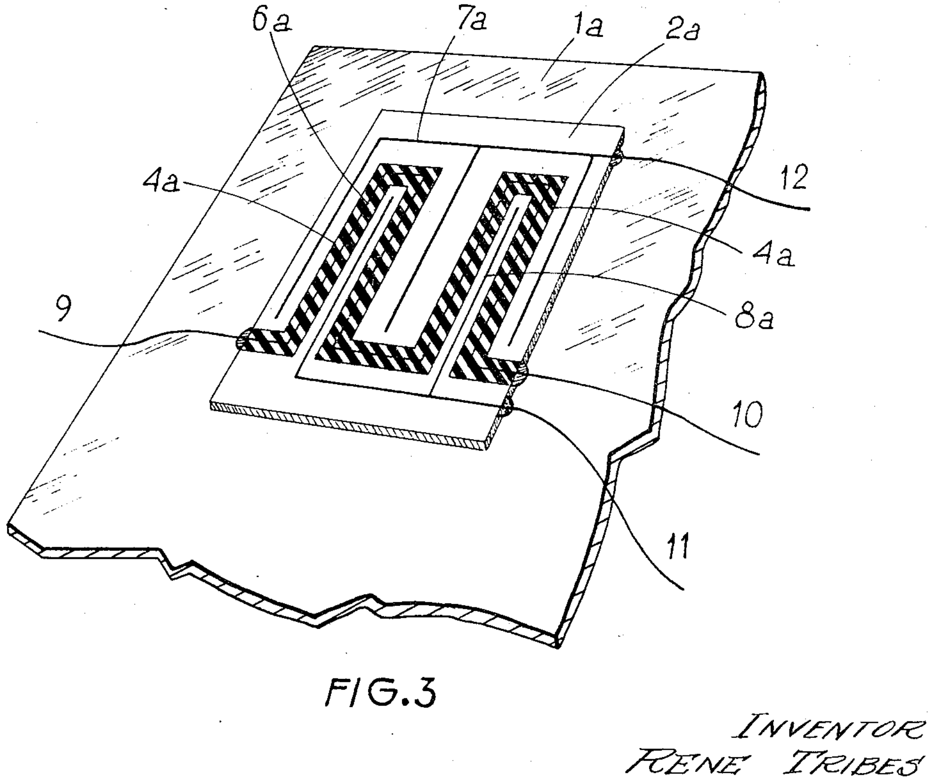
FIG. 3 shows a modification.

The variant shown in FIG. 3 does not differ essentially from that just described; for this reason the corresponding elements have been given the same reference numbers, followed by the letter *a*.

It will be noted that the ohmic contacts terminate at terminals 9 to 12 formed on the silica layer of plate 1; the input impedance of the arrangement will naturally be very high, this being one advantage of this technique.

The new feature of the modification shown in FIG. 3 lies essentially in the fact that, owing to the wavy shape of strip **4*a***, the dimension of the channel at right angles to the direction of motion of the charge carriers is as large as possible for a given dimension of the micro-structure and so the current is increased thereby.

Naturally, the shapes and dimensions illustrated are given purely for the purpose of illustration; the process which is the object of the invention permits producing a great variety of field effect structures with the same advantages.

I claim:

1. A method of manufacturing field effect semiconductor devices comprising the steps of forming a silica layer on a silicon plate of a predetermined type of conductivity; etching said silica layer, over a predetermined surface portion of said plate, thus forming a window laying bare the silicon in said window; forming by means of a mask upon a predetermined portion of said window, another silica laye extending across said window, for forming in said window, a first and a second region separated from each other by said other silica layer, said other silica layer having a thickness less than said first mentioned layer, and diffusing activator impurities of the conductivity opposite to said predetermined type, into said substrate, in said window region, for forming respectively in said first and said second region, a source and a drain region and under said other silica layer, a channel by placing said silicon plate in a gas carrying a doping agent, depositing upon said source and drain region metallic contacts, and upon said other silica layer, a metal gate.

* * * * *